(12) United States Patent
Park et al.

(10) Patent No.: US 6,555,450 B2
(45) Date of Patent: Apr. 29, 2003

(54) CONTACT FORMING METHOD FOR SEMICONDUCTOR DEVICE

(75) Inventors: Young-Hoon Park, Kyonggi-do (KR); Jin-Hun Lee, Kyonggi-do (KR); Myoung-Hee Han, Kyonggi-do (KR); Hyo-Dong Ban, Kyonggi-do (KR); Eun-Young Min, Kyonggi-do (KR); Won-Hee Jang, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/971,778

(22) Filed: Oct. 4, 2001

(65) Prior Publication Data

US 2002/0068423 A1 Jun. 6, 2002

(30) Foreign Application Priority Data

Oct. 4, 2000 (KR) .......................... 2000-58121

(51) Int. Cl.⁷ .................. H01L 21/425; H01L 21/44
(52) U.S. Cl. .................. 438/533; 438/597; 438/622; 438/657
(58) Field of Search .................. 438/256, 597, 438/622, 657, 532, 533

(56) References Cited

U.S. PATENT DOCUMENTS

| 6,008,084 A | * | 12/1999 | Sung ............... 438/241 |
| 6,137,179 A | * | 10/2000 | Huang ............... 257/763 |
| 6,150,689 A | * | 11/2000 | Narui et al. ........... 257/306 |

\* cited by examiner

Primary Examiner—T. N. Quach
(74) Attorney, Agent, or Firm—Marger Johnson & McCollom P.C.

(57) ABSTRACT

A contact forming method of a semiconductor device is disclosed, in which a pad polysilicon layer is formed at an active region of a cell array, thereafter an upper portion of a gate is opened when a spacer of a NMOS transistor region is formed. And at the same time a gate capping insulating layer of the cell array region, the active region of the NMOS transistor and the gate node contact region remains at a predetermined thickness by etching the spacer. And then, by performing an ion implantation procedure on the entire surface, the direct pad polysilicon layer and the buried pad polysilicon layer are simultaneously ion-implanted.

7 Claims, 13 Drawing Sheets

CP: CELL PAD POLY-Si
SP: STORAGE POLY-Si

CONTACT FORMING METHOD FOR SEMICONDUCTOR DEVICE

BACKGROUND OF THE INVENTION

1. Field of the Invention

The present invention relates to a contact forming method for a semiconductor device, more particularly to a contact forming method by which a direct contact (DC contact) resistance and a buried contact (BC contact) resistance can be lowered by performing ion-implantation only one time.

2. Description of the Related Art

As the high integration rate in a semiconductor device increases, the area of the memory cell accordingly rapidly decreases. The wiring line area in a memory cell and the gap between the wiring lines also have decreased. In addition, the contact area being formed to electrically connect the isolated-device regions has been required to be miniaturized. There has been a concerted effort to concentrate efforts on increasing the capacitance per unit area in a DRAM. The result is a capacitor over bit-line structure (COB) in which a capacitor is formed after the formation of bit-line has been introduced.

In such a COB structure, the bit line is electrically connected to a drain region of a transistor by the DC contact, and a source region of the transistor and a storage node, which are lower electrodes of the capacitor, are electrically connected to each other by a BC contact. Accordingly, the highly integrated semiconductor memory necessarily requires the DC contact and the BC contact.

Since forming contact holes (in which contacts contacting with such source/drain regions are to be formed) cause misalignment, the contact hole forming regions are formed with pad poly-silicon layers to prevent such a misalignment. When the pad poly-silicon layers are applied, the misalignment error of photoresist can be overcome even in a submicron application.

However, as the contact size decreases, there is a problem of speed delay caused by high resistances of the DC contact and the BC contact, i.e., RC delay occurs. Particularly, the problem is, contact resistance of the DC contact or BC contact with the pad poly silicon layer increases when contact sizes are less than 0.1 micrometer ($\mu$m).

Figure 1:
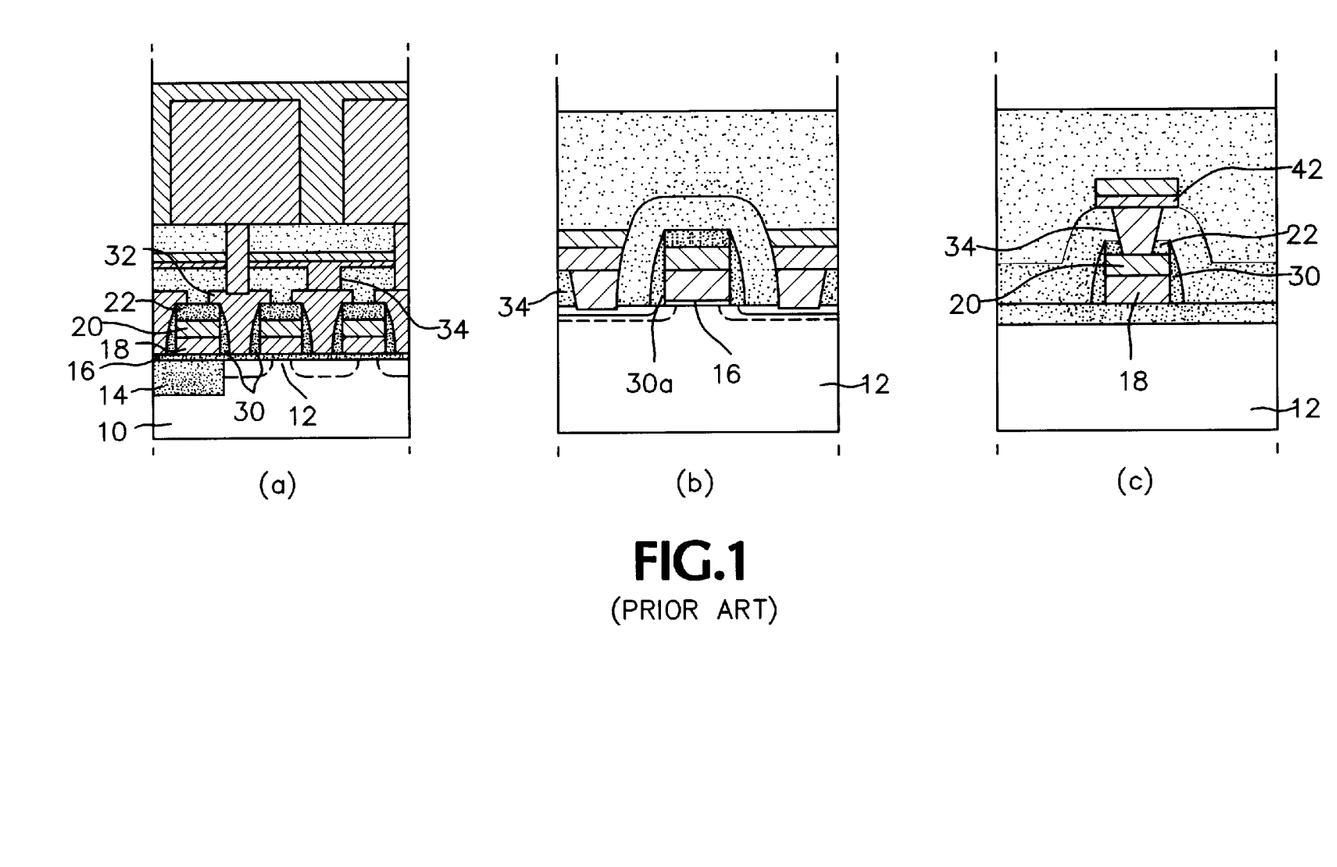
FIGS. 1(a)–(c) are a cross-sectional view illustrating the contact forming method of the conventional prior art.

FIG. 1 shows a conventional semiconductor memory device having DC contact and BC contact structure, e.g., a DRAM device. The (a) area illustrates a cell array region, the (b) area illustrates an active region of an NMOS transistor of the peripheral circuit and the (c) area illustrates a gate node contact region. The DC contact and BC contact forming method in accordance with a conventional prior art will be explained as follows with reference to the accompanying FIG. 1.

Referring to (a) and (b), the active region 12 and the device isolation region 14 are formed on the silicon substrate 10. The gate oxide layer 16 is formed on the silicon substrate 10 and the device isolation region 14. The polycide gates 18, 20 and the capping oxide layer 22 are formed in series. Thereafter, the spacer oxide layer 30 is formed in a cell array region. The conductive impurities-doped pad poly silicon layer 32 is formed between the spacer oxide layers 30, and the cell array region is covered by a photoresist.

Next, the spacer oxide 30a is formed in an active region of the NMOS transistor of the peripheral circuit shown in FIG. 1, and the N+ source/drain regions are formed in the active region. The photoresist is removed and the contact holes 34 are formed in the cell array region, active region of the NMOS transistor and gate node contact region, as shown in FIG. 1. The bit lines 42, 44 are formed above the DC contact 34 formed in the cell array region, and the BC contact id formed in the cell array region. Thereafter, the poly silicon layer for the storage node is formed.

Figure 2:
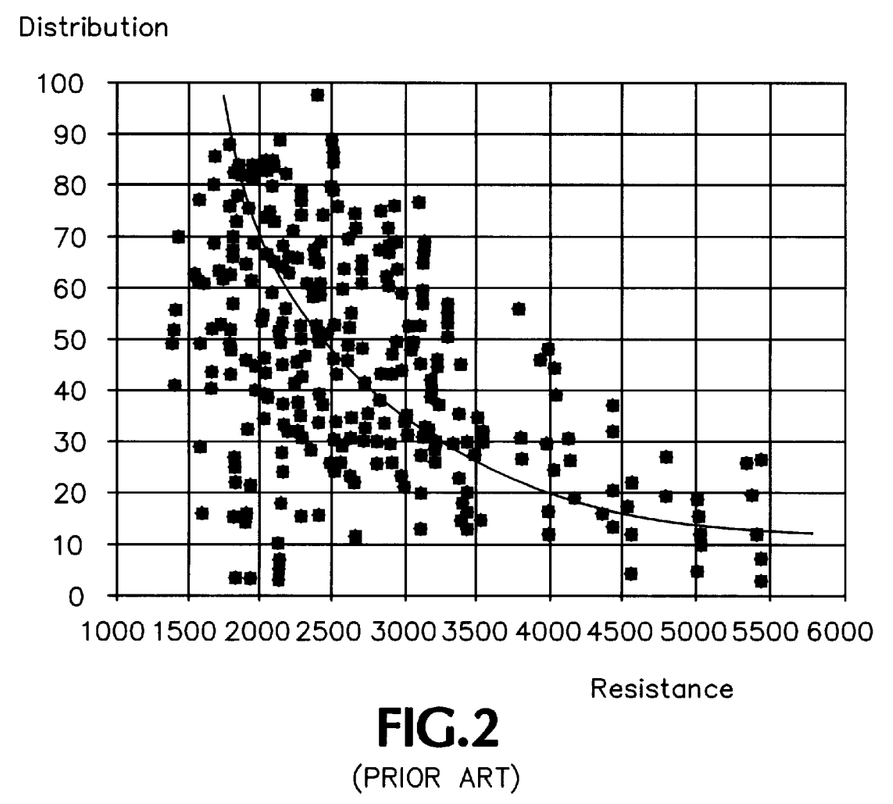
FIGS. 2 and 3 are a graph illustrating the resistance distribution and a cross-sectional view showing a prior art semiconductor structure having storage and cell pads, respectively.
Figure 3:
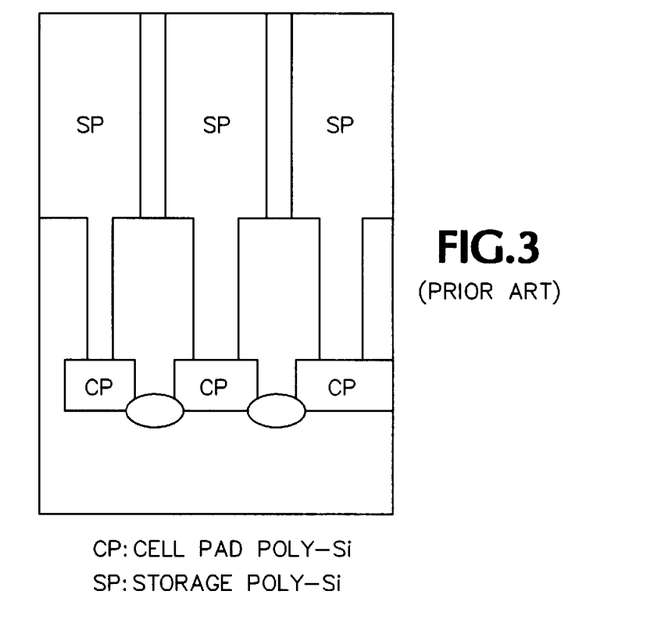

In case the contact size is more than 0.15 $\mu$m, there is no problem in such a conventional method. Referring to FIG. 2 showing the resistance distribution in a prior art semiconductor structure having storage and cell pads shown in FIG. 3, however, the broad resistance-distribution and high resistance of the poly silicon layer for the storage node from the pad poly silicon layer cause delays in signal transfer speed as follows. In order to solve such a problem, when the pad silicon layer is formed by deposition of doped polysilicon, it may be suggested a method that the doping dosage of the pad poly silicon layer is raised to 1E+21/cm$^2$ to thereby lower the resistance. But, this method causes another problem. That is, the increase in the doped concentration of the pad poly silicon layer causes a high level of doping to diffuse into the N− source/drain region. As a result, the doped concentration of the N− source/drain of the active region of the NMOS transistor increases. Accordingly, the intensity of the electric field of the N− source/drain increases, thereby causing refresh in a DRAM.

Figure 4:
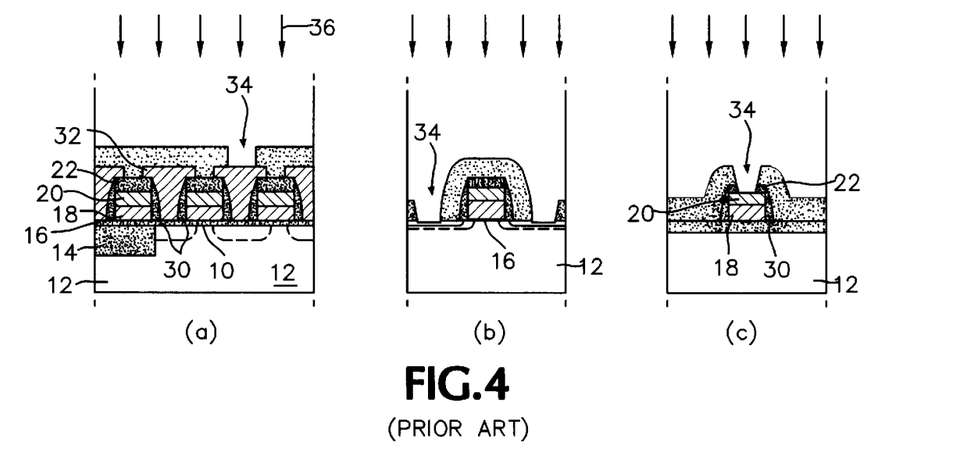
Figure 5:
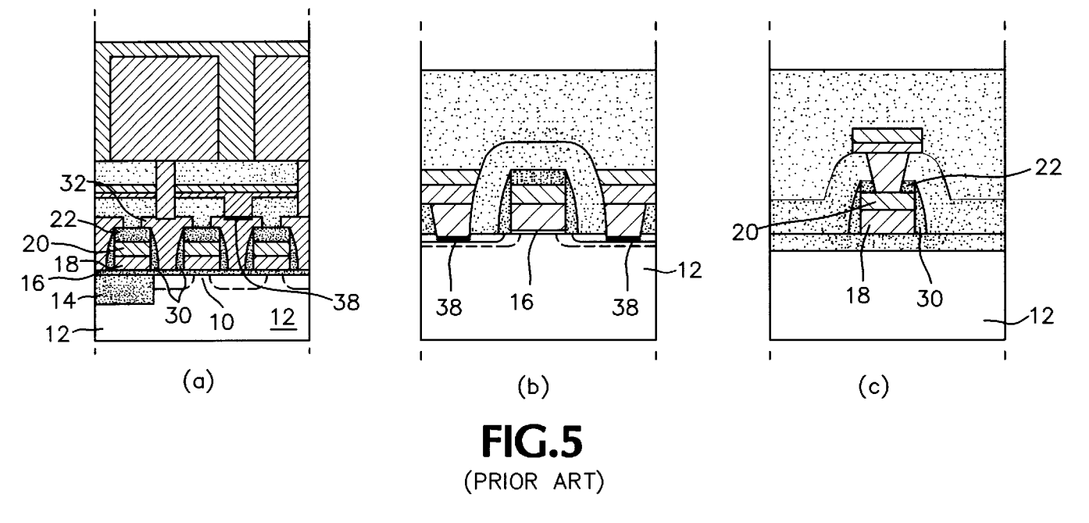
Figure 6:
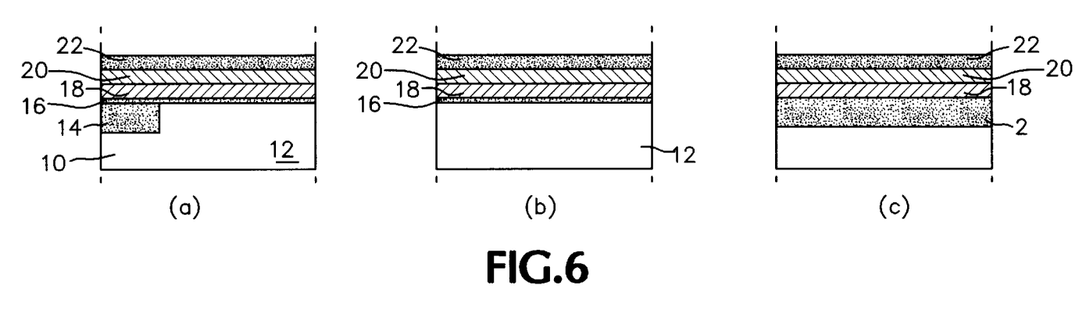

FIGS. 4 and 5 illustrate another conventional contact forming method, in which a plug ion implantation method is applied to the DC contact region in order to solve the problems of the conventional techniques shown in FIG. 1.

Referring to FIGS. 4(a), (b) and (c), with the same method as described previously, the DC contact hole 34 is formed above the pad poly silicon layer 32 formed above the active region, and then the contact plug ion implantation on the whole surface is performed according to the same process as shown in FIG. 1. The poly silicon layer for bit line, BC contact and storage node, which is formed in such a way shown in FIG. 5.

By carrying out the contact ion-implantation into the DC contact holes 34 formed in the cell array region, NMOS transistor active region, and field gate node contact region respectively, as shown in FIG. 5(a), (b), (c), the silicide gate contact in the surrounding region is improved and at the same time the DC contact resistance in the cell array region is improved. However, the additional plug ion implantation causes an additional process requiring additional time and cost. Also, the DC contact resistance in the DC contact region is improved, but the BC contact portion still has the conventional problem.

SUMMARY OF THE INVENTION

Accordingly, in order to solve the aforementioned problems it is an object of the present invention is to provide a method of fabricating a contact of the semiconductor memory device by which the resistances of a DC contact and a BC contact are prevented from being increased, and it is another object of the present invention to provide a method of fabricating a semiconductor memory device in which ion-implantations into a cell array region and an NMOS surrounding region are simultaneously carried out using the N+ source/drain ion-implantation procedure when an active region of the NMOS transistor of the peripheral circuit is formed, thereby preventing increase in the resistances of the DC contact and BC contact.

In accordance with the objects of the present invention, there is provided a contact forming method of a semiconductor memory device including a cell array region and the surrounding circuit region comprises steps of:

forming gates in the cell array region, active region of the surrounding circuit region, and a field insulating layer of the surrounding circuit region and forming source and drain in the active region;

forming an insulating layer on a whole surface on the surrounding circuit region and the cell array region, and forming a spacer by etching the insulating oxide layer in the cell array region, and thereafter forming conductive impurities-doped poly silicon layer on all the resultant regions;

patterning the poly silicon layer formed on the cell array region, and etching the poly silicon layer and the insulating layer formed on the surrounding circuit region, thereafter forming a spacer insulating layer on a side wall of gate of the surrounding circuit region;

thinning the capping insulating layer formed on the gate formed in the cell array region and the surrounding circuit region for ion-implantation of conductive impurities; and forming a high concentration of doping region on the poly silicon layer formed in the cell array region.

In order to prevent a short in the bit line being formed in the pad poly silicon layer within the cell array region and in its upper portion, the method further comprises steps of forming an interlayer insulating layer on the whole resultant surface, forming bit lines connected to the pad silicon layer through the interlayer insulating layer, forming a BC contact hole after forming a second interlayer insulating layer covering the bit lines on the interlayer insulating layer, and forming a contact plug in the BC contact hole.

The insulating oxide layer is formed to about 500 Å to 2500 Å in thickness with silicon nitride, thinning the capping insulating layer continues until the thickness of the capping insulating layer becomes about 200 Å~1000 Å.

In accordance with another embodiment of the present invention, a contact forming method for a semiconductor memory device having a cell array region and the surrounding circuit region comprises:

forming device isolation layers for defining an active region on a substrate of the cell array region and the surrounding circuit;

forming a gate deposition material on the device isolation layers at the substrate in the cell array region, the active region of the surrounding circuit region, and the surrounding circuit region;

forming source/drain on the active region of the cell array region and the surrounding circuit region;

forming a first insulating layer covering the gate deposition material on the substrate and patterning the first insulating layer so that the source/drain between the gate deposition materials of the cell array region is exposed;

filling the exposed source/drain of the cell array region with conductive plugs;

forming a second insulating layer on the first insulating region and exposing the conductive plug of the cell array region, the source/drain of the surrounding circuit region and the gate deposition material by etching to thereby form contact holes;

forming a first conductive impurity layer on all the exposed regions; and forming a metal wiring layer being in contact with all the exposed regions at which the conductive impurity layer is formed on the second insulating layer.

The method further comprises the step of forming a second conductive impurity layer on the conductive plug prior to the formation of the second insulating layer.

The metal wiring layer comprises a titanium (Ti) layer, a titanium nitride (TiN) layer and a tungsten (W) layer.

According to the present invention, the conductive pad region being formed at the cell region, the source and drain regions of a transistor formed at the surrounding circuit, and the contact exposing the gate node region being used as a word line could be concurrently or simultaneously formed. And conductive impurity concentration could be increased only in the contact. Thereby, the partial layer exposed through the contact and the ohmic contact resistance between the material layers filling the contact, e.g., the ohmic resistance between the bit lines consisting of a poly silicon layer and a titanium layer/titanium nitride layer/tungsten layer, can be decreased.

BRIEF DESCRIPTION OF THE DRAWINGS

FIGS. 4(a)–4(c) and 5(a)–5(c) are cross-sectional views illustrating by stages the contact forming method of the semiconductor device according to another conventional prior art;

FIGS. 6(a)–6(c), 7(a)–7(c), 8(a)–8(c), 9(a)–9(c), 10(a)–10(c), 11(a)–11(c), 12(a)–12(c), 13(a)–13(c) are cross-sectional views illustrating by stages the contact forming method of the semiconductor device according to a first embodiment of the present invention;

FIGS. 14(a)–14(c), 15(a)–15(c), 16(a)–16(c), 17(a)–17(c), 18(a)–18(c), 19(a)–19(c) are cross-sectional views illustrating by stages the contact forming method of the semiconductor device according to a second embodiment of the present invention;

FIGS. 20(a)–20(c), 21(a)–21(c), 22(a)–(c) are cross-sectional views illustrating sequentially the contact forming method of the semiconductor device according to a third embodiment of the present invention.

DETAILED DESCRIPTION OF THE PREFERRED EMBODIMENTS

The contact forming method according to the first to third embodiments of the present invention will be explained below with reference to the accompanying drawings.

First Embodiment

In FIGS. 6 to 13, details (a), (b) and (c) show, respectively, in cross section, the cell array region, the NMOS transistor region formed at the surrounding circuit region, and the field gate node contact region. Also, these are like the accompanying drawings relating to the second and third embodiments.

Referring to FIG. 6(a), the substrate 10 is divided into the active region 12 and the device isolation region 14.

The substrate 10 and device isolation region 14 are sequentially formed with a gate oxide layer 16, conductive impurity-doped poly silicon layer 18, tungsten silicide layer 20, and capping insulating layer 22 thereabove. And then, the capping insulating layer 22, tungsten silicide layer 20, and poly silicon layer 18 are etched in a reverse order by an isotropic etching method. As a result, as shown in FIG. 7, a gate node including the conductive impurity-doped poly silicon layer 18, tungsten silicide layer 20 and capping insulating layer 22 are formed on the substrate 10.

Figure 7:
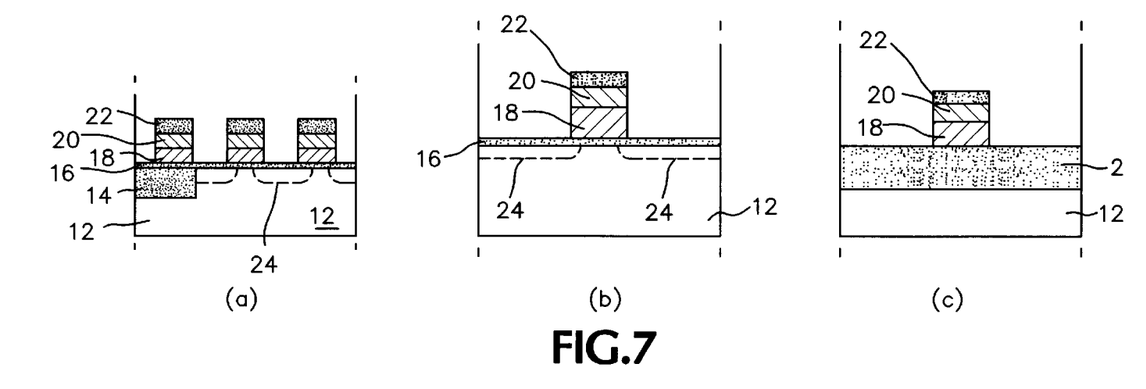

Referring to FIG. 7, the N− source/drain region is formed at the cell array region and the surrounding circuit region by ion-implanting N-ions onto the substrate at which the gate node is formed on the order of 1E+13/cm$^2$.

Figure 8:
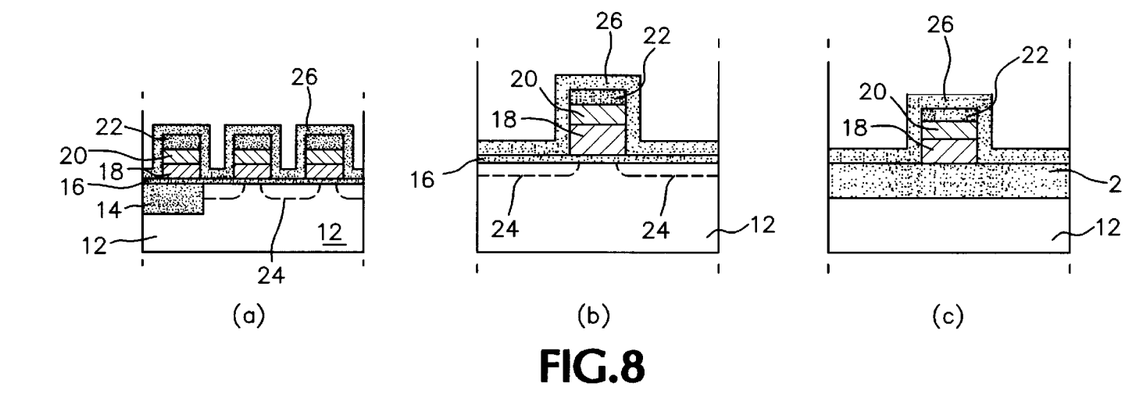

Referring to FIG. 8, an insulating oxide layer 26 covering normally (substantially) the whole surface of the gate node is formed on the substrate 12. It is preferred that the insulating oxide layer 26 is formed in a thickness of 500 Å–2500 Å with a silicon nitride layer.

Figure 9:
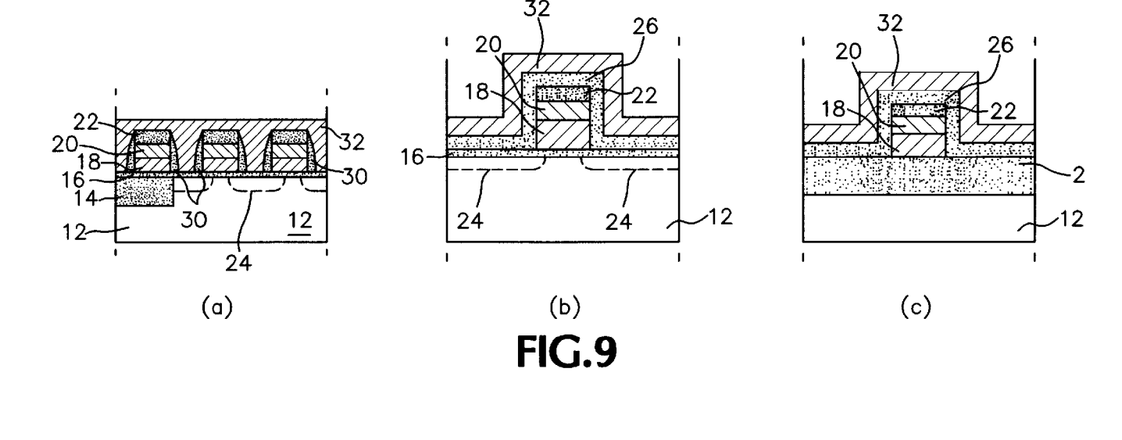

Referring to FIG. 9, the cell array region is exposed and a photo-resist pattern (not shown) covering the surrounding circuit region is formed, thereafter the spacer 30 is formed by dry-etching substantially the whole surface of the insulating oxide layer 26 using the pattern as a mask. After the photo-resist is removed, the poly silicon layer 32 doped with conductive impurities is formed on the whole resultant surface over which the spacer 30 is formed within the cell array region.

Figure 10:
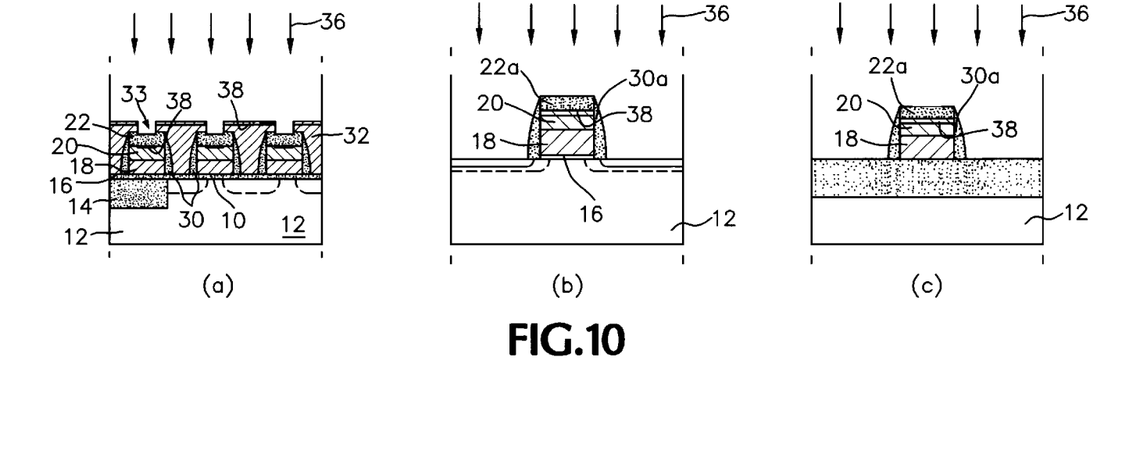

Referring to FIG. 10, the doped poly silicon layer 32 is patterned at the cell array region by a photo-etching process and etched-back at the surrounding circuit region. In this way, the poly silicon layer 32, doped at a region other than the cell array, is entirely removed.

By etching the insulating oxide layer 26 formed at the surrounding circuit region, the spacer 30a is formed at the gate node of the NMOS transistor of the surrounding circuit region and at the side wall of the field node gate. At that time, a portion of the capping insulating layer 22 of the cell array region is also removed. The etching objective is to maintain the gate node in the surface thickness of 100 Å to 200 Å to reach the maximum range during ion-implantation. In addition, the ion-implantation is also performed in order to form N+ source/drain on the whole substrate 10. For example, the ion-implantation is performed with a dosage of 1E+15 to 1E+16/cm$^2$ by supplying an energy of 10 KeV to 50 KeV. In such a way, ions are implanted onto the whole surface of the DC pad poly silicon layer located at the cell array region and BC pad poly silicon layer simultaneously. In addition, an upper portion of the gate is ion-implanted by performing an ion-implantation of high integration onto the gate capping insulating layer 22a having a predetermined thickness. Accordingly, the gate node in the peripheral circuit region and the pad poly-silicon layer 32 are formed thereon with a high integration of impurity layer 38. As a result, the contact resistance of a gate can be reduced and an additional process is not needed. This is because of the simultaneously performed ion-implantation, thereby simplifying the processes.

Figure 11:
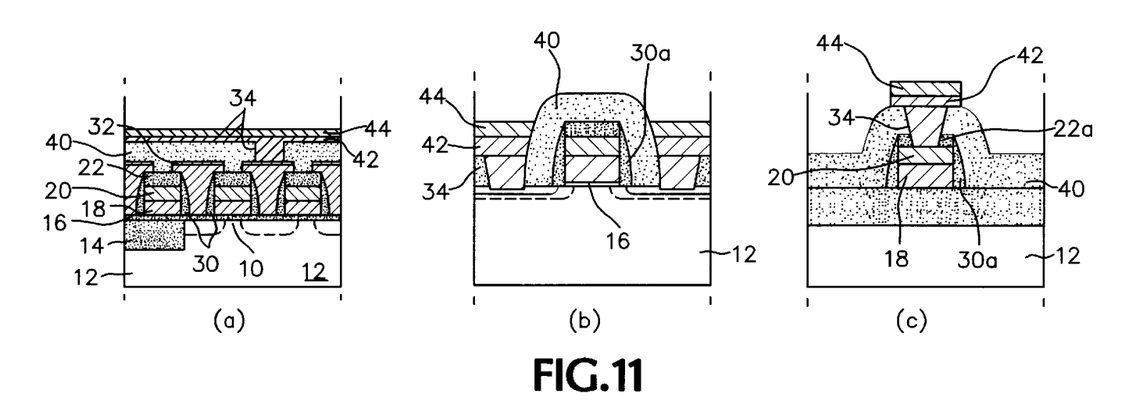

Referring to FIG. 11, after the capping insulating layer 22 is etched to a consistent thickness, the interlayer-insulating-layer 40 is formed on the whole resultant surface doped with a conductive impurity. The interlayer insulating layer 40 serves to prevent shorts between the pad poly silicon layer 32 and the bit lines 42, 44 to be formed on the interlayer insulating layer 40. And then, by patterning the interlayer insulating-layer 40, the direct contact DC hole 34 is formed at the cell array region, NMOS transistor source/drain region, and gate node contact region. In addition, the tungsten silicide layer 44 and the poly silicon layer 42 filling the DC hole 34 are sequentially formed and patterned on the interlayer insulating-layer 40. Through these procedures, the bit lines 42, 44 are formed.

Figure 12:
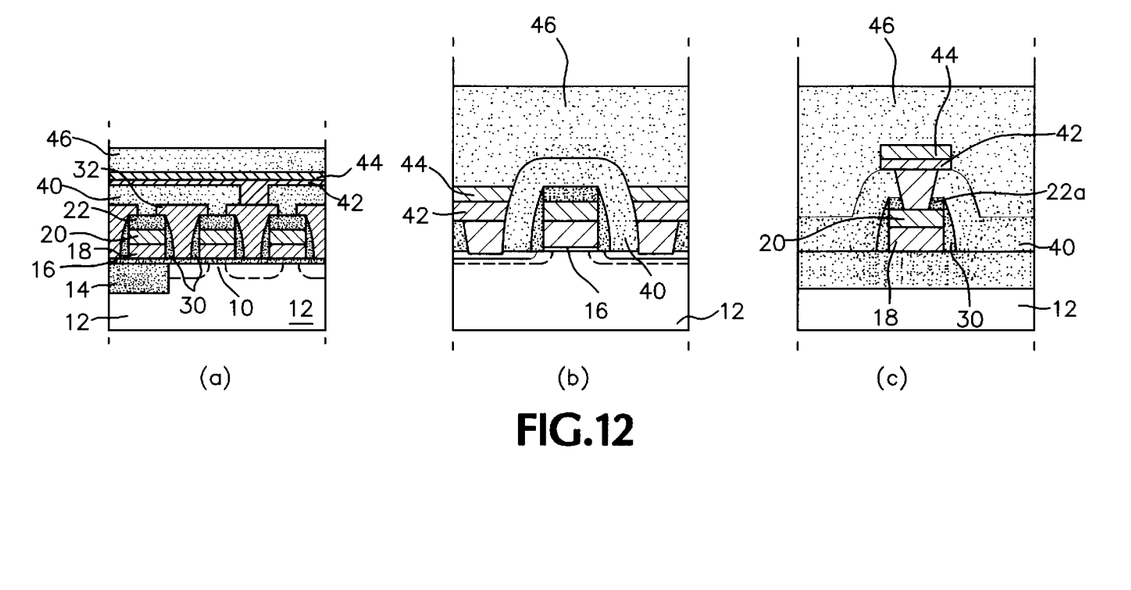

Referring to FIG. 12, the interlayer insulating-layer 46 is formed on the interlayer insulating-layer 40 to cover the bit lines 42, 44. The interlayer insulating-layer 46 is to prevent shorts between the bit lines 42, 44 and the storage node to be formed later.

Figure 13:
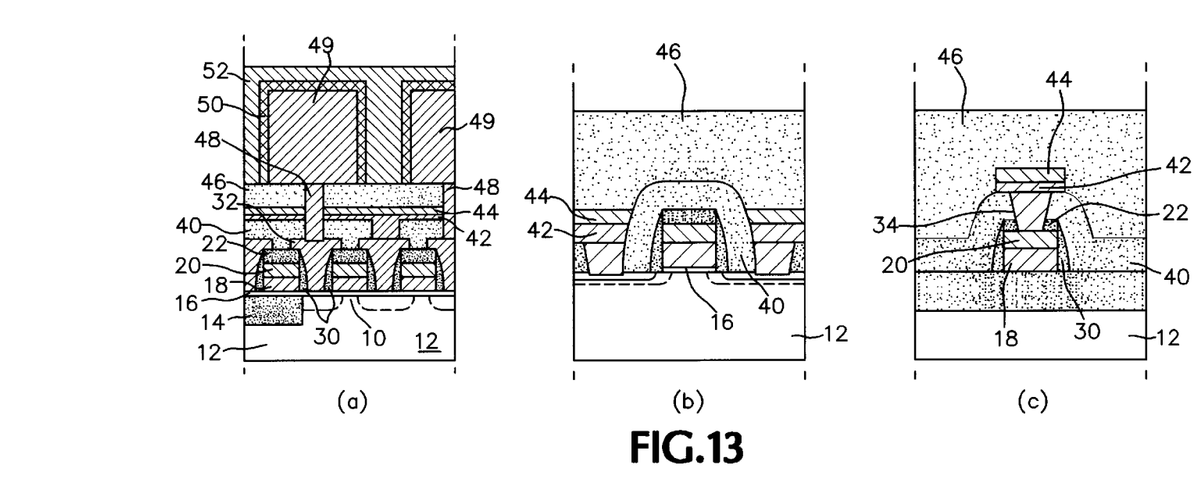

Referring to FIG. 13, the buried contact hole is formed on the interlayer insulating-layer 46 to expose the pad poly silicon layer 32. The BC hole is formed therein with the poly silicon layer 48 for the storage node as a conductive plug. The interlayer insulating-layer 46 is formed thereon with the lower electrodes 49 being in contact with the entire surface of the poly silicon layer 48 for the storage node. The whole surface of the lower electrodes 49 is coated with the dielectric film 50 on which the plate poly silicon layer 52 is formed as an upper electrode.

Second Embodiment

Figure 14:
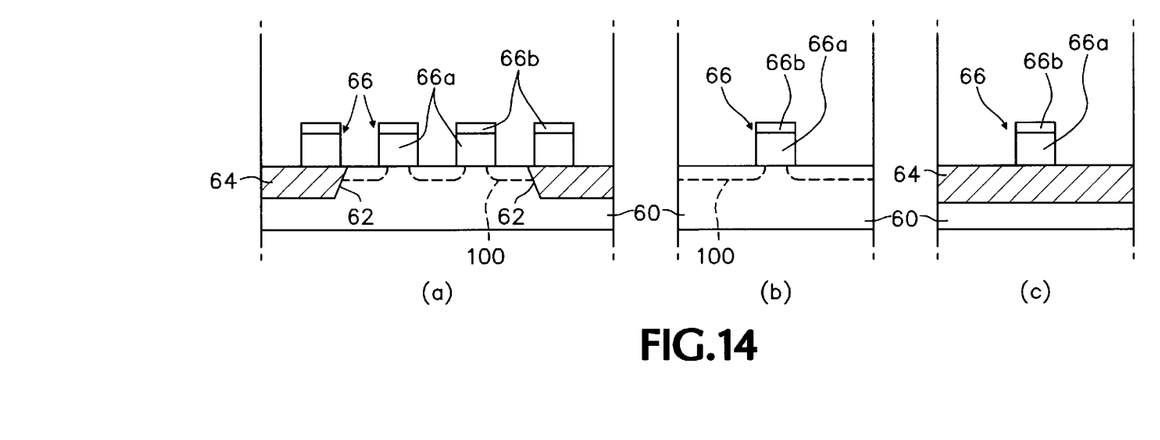

Referring to FIG. 14, the substrate 60 is divided into a cell region and a peripheral circuit region, and the respective regions are divided into a field region and an active region, respectively. The field region of the substrate 60 is formed therein with the trench 62 in which the device isolation layer 64 is filled. The gate deposition material 66 is formed at the active region of the substrate 60. The gate deposition material 66 includes a gate conductive layer 66a having a border layer between the gate conductive layer and the substrate, and a gate insulating layer 66b formed on the gate conductive layer 66a. The border layer is formed therein with a gate oxide layer (not shown). The gate oxide layer is formed in a 6 nm thickness by a thermal oxidation. The gate conductive layer 66a has multiple layers. For example, the gate conductive layer 66a is formed by forming the conductive impurity doped poly silicon layer and the tungsten silicide layer in that order. It is desirable that the doped poly silicon layer should have a thickness of about 80 nm and the tungsten silicide layer should have a thickness of about 100 nm. In addition, the gate insulating layer 66a is formed to a thickness of about 200 nanometers (nm). N− impurity (not shown) is ion-implanted with a dosage of 1E+13/cm$^2$ in an energy of 20–40 KeV onto the whole substrate, thereby the transistors of the cell array region and the peripheral circuit region are formed therein with N− source/drain 100.

Figure 15:
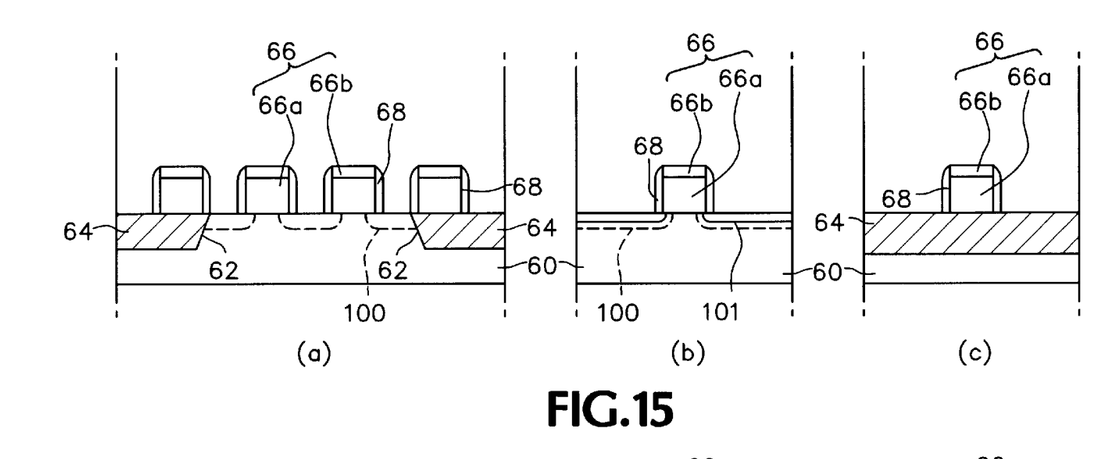

As shown in FIG. 15, a gate spacer 68 is formed on the sidewall of the gate deposition material 66 to be in contact with the substrate 60. The gate spacer 68 is formed with a nitride layer. The nitride layer is formed on the entire surface of the substrate 60 on which the gate deposition material 66 is formed, and then the entire surface is dry-etched by aeolotropy (anisotropy). At this time, the nitride layer should be of a thickness of about 60 nm. And, photo-resist pattern (not shown) covering the cell array region is formed and N+ impurity is ion-implanted with a dosage of 1E+15/cm$^2$ in an energy of 20–50 KeV onto the peripheral circuit region, thereby forming N+ source/drain 101.

Figure 16:
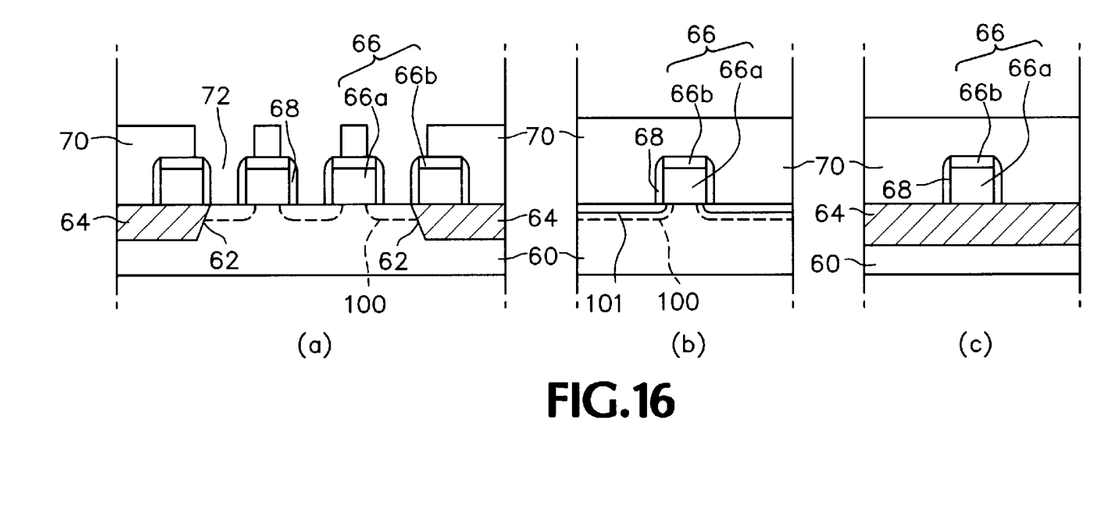

Referring to FIG. 16, the first insulating layer 70 covering the gate deposition material 66 (along with side wall spacers 68) is formed on the substrate 60 as an interlayer insulating-layer. The first insulating layer (e.g. oxide 70) is formed to about a 500 nm thickness. The contact hole 72 is formed by patterning the first insulating layer 70 so that the substrate 60 is exposed between the gate deposition materials 66 at the cell array region. At this time, the other regions of layer 70 excluding the cell array region remain. The contact hole 72 is self-aligned due to the gate insulating layer 66b, and the gate spacer 68 as is known.

Figure 17:
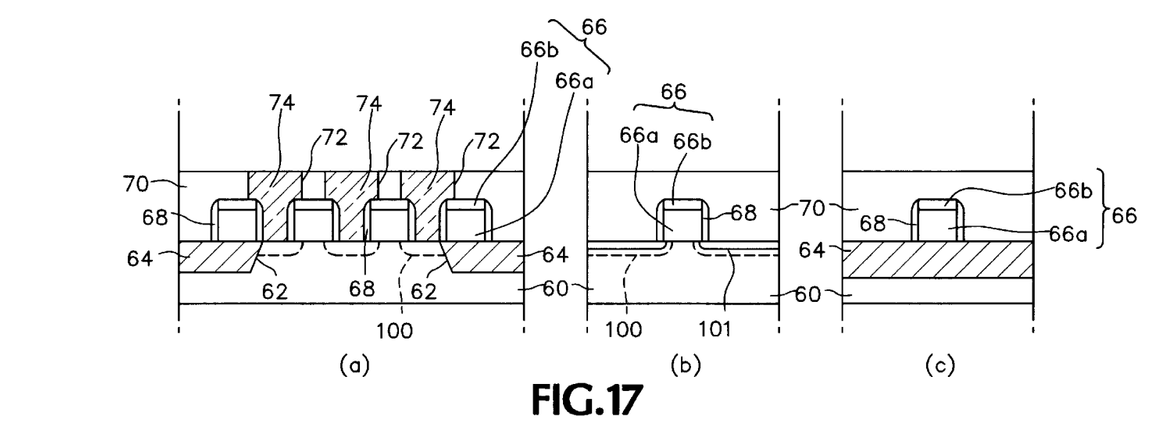

Referring to FIG. 17, the first insulating layer 70 is formed thereon with a contiguous conductive layer (not shown) also filling the contact holes 72. The conductive layer is formed with a conductive impurity doped poly silicon layer. At this time, the conductive layer is formed to about a 250 nm thickness. The entire surface of the conductive layer is planarized by an etch-back procedure until the first insulating layer 70 is exposed. As a result of the planarization, conductive plugs 74 are formed to fill the contact holes 72, using the plugs 74 as a pad conductive layer.

Figure 18:
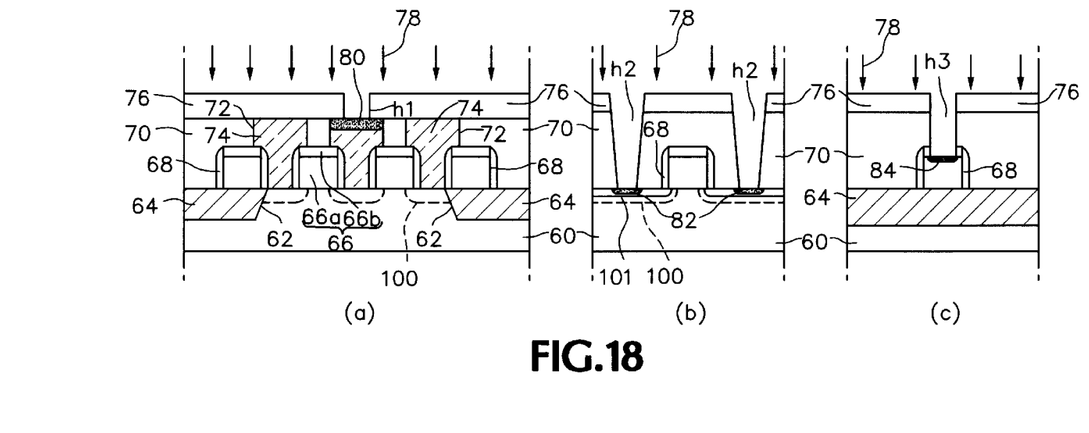

Referring to FIG. 18, the second insulating layer 76 is formed on the first insulating layer to cover the entire surface of the conductive plugs 74. The second insulating layer 76 is formed with an oxide layer of about 200 nm in thickness. The second insulating layer 76 is coated with a photo-resist layer (not shown). The photo-resist layer is patterned, exposing a portion formed on the conductive plug 74 out of the second insulating layer 76; a portion formed on the source/drain region 101 of the transistor at the peripheral circuit region, and a portion formed on the gate deposition material of the transistor of the peripheral circuit region.

By using the photo-resist pattern as an etching mask, the exposed portion of the second insulating layer 76 is etched. It is preferred that the etching method is an aeolotropic (anisotropic) dry-etch. The etching is continued until the conductive plug 74; the source/drain region 101 of the transistor of the peripheral circuit region; and the conductive material layer of the gate deposition material 66 of the transistor of the peripheral circuit region, i.e., the gate conductive layer 66a are exposed. Thereafter, the photo-resist layer is removed.

As a result, the first via hole h1 is formed at the cell array region to thereby expose the conductive plugs 74, the second via hole h2 is formed to expose the substrate of the source/drain 101 of the transistor in the peripheral circuit region, and the third via hole h3 is formed thereby exposing the gate conductive layer 66a of the gate deposition material 66.

Next, the conductive impurities 78 are implanted onto the entire resultant surface from which the photo-resist pattern is removed. At this time, the conductive impurities are implanted onto only the respective regions exposed through the first, second and third via holes h1, h2, h3 because all the regions excluding the first, second and third via holes h1, h2, h3 are covered with the second insulating layer 76. The ion-implanted impurities are adapted to use phosphorus (P), the phosphorous is implanted in the order of $2E+15/cm^2$ in concentration and in the order of 50 KeV in energy. As a result, the conductive impurity layer 80, 82, 84 are respectively formed on the conductive plug 74 of the cell array region, on the source/drain region 101 of the peripheral circuit region, and on the gate conductive layer 66a of the gate deposition material 66.

Figure 19:
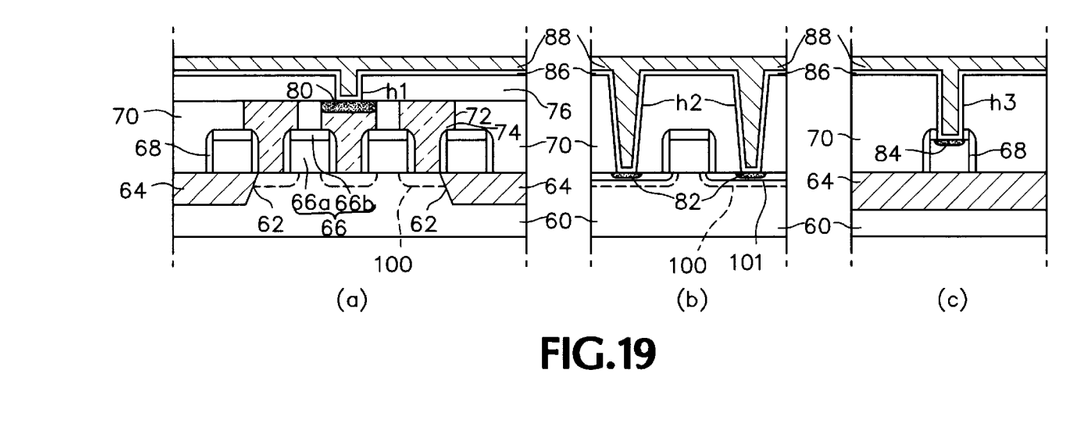

Referring to FIG. 19, the first metal wiring layer 86 is in contact with the region exposed through the first, second, third via holes h1, h2, h3 at the second insulating layer 76. The first metal wiring layer 86 is in order formed with a titanium (Ti) layer and a titanium nitride (TiN) layer as a multi-metal wiring layer. Next, a thermal treatment should be performed for a predetermined time in order to form the silicide layer between the titanium layer and the lower layer, the so-called n+ polysilicon, the silicide layer being in contact with the titanium layer. Thereafter, the second metal wiring layer 88 is formed on the first metal wiring layer 86, filling in the first, second, third via holes h1, h2, h3. The second metal wiring layer 88 is formed with tungsten. In such a way, the metal wiring layer, i.e., bit line (consisting of titanium layer/titanium nitride layer/tungsten layer which are simultaneously in contact with the conductive plug 74, the source/drain region 101, and gate conductive layer 66a through the first, second, third via holes h1, h2, h3) is formed on the second insulating layer 76.

Third Embodiment

The steps in the range of the first step to the step of forming the conductive plug 74 on the cell array region are performed in the same manner as the second embodiment.

Figure 20:
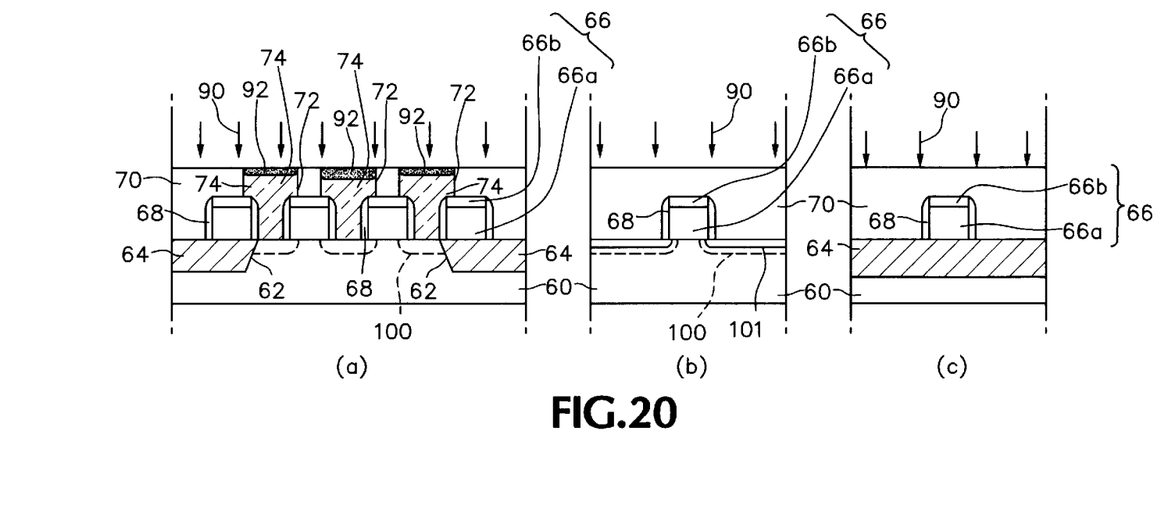

Referring to FIG. 20, the conductive impurity 90 is ion-implanted over the entire surface of the resultant structure on which the conductive plug 74 is formed. The conductive impurity 90 is ion-implanted onto only the conductive plug 74 formed on the cell array region because the other regions excluding the cell array region are covered with the first insulating layer 70. The conductive impurity 90 and the ion implantation is the same as in the second embodiment. As a result of the ion-implantation, the first conductive impurity layer 92 is formed over the conductive plugs 74.

Figure 21:
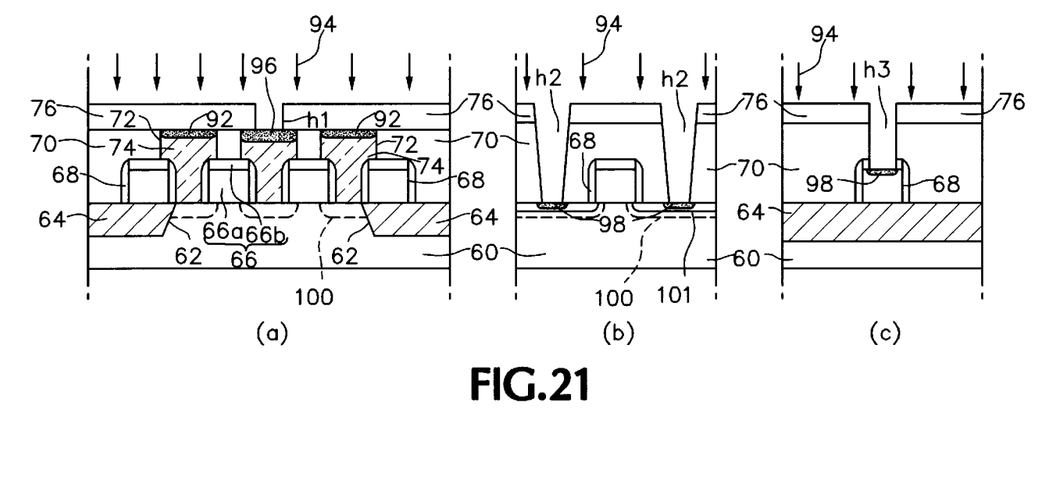

Referring to FIG. 21, the second insulating layer 76 (including the first, second, third via holes h1, h2, h3) is formed, as described in connection with the second embodiment. An ion implantation is performed over the entire surface of the resultant structure on which the second insulating layer 76 is formed, in the same manner as in the second embodiment. As a result, the second conductive impurity layers 96, 98 are formed on the region exposed through the first, second, third via holes h1, h2, h3. The second conductive impurity layer 96 formed on the conductive plug 74 is made by ion-implantation into the first conductive impurity layer 92 in the same concentration and energy as the above described manner. However, the second conductive impurity layer 96 is deeply formed compared with the second conductive impurity layer 98 formed on other regions. In addition, since the aforementioned ion implantation energy is the same, the conductive impurity concentration becomes high compared with the other region.

Figure 22:
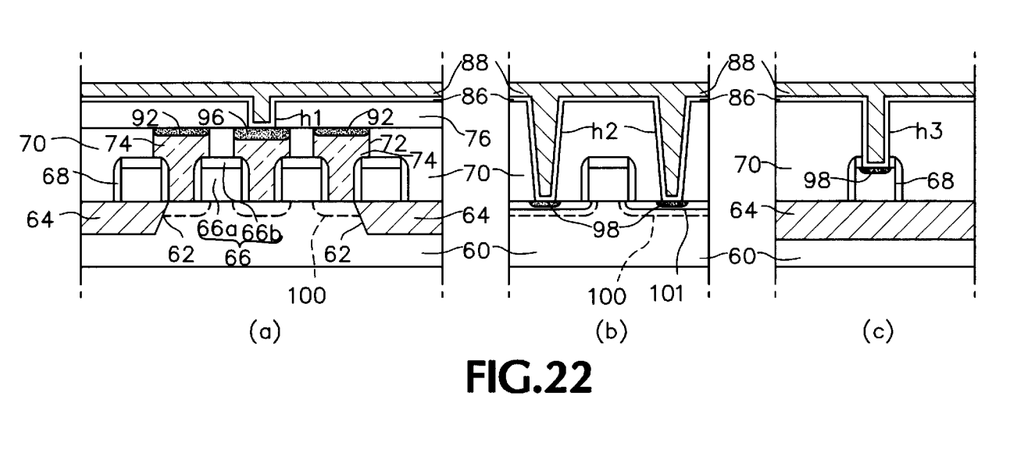

FIG. 22 illustrates the sequential steps of forming on the second insulating layer 76 the first and second metal wiring layer 86, 88 being in contact with the region exposed through the first, second, third via holes h1, h2, h3, in the same way as the second embodiment.

Figure 23:
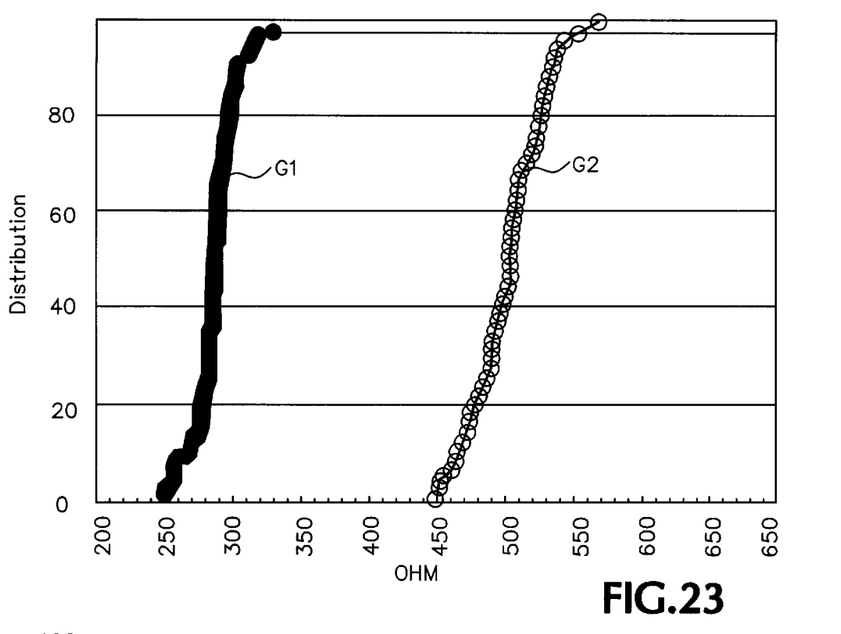
FIGS. 23 and 24 are graphs for comparing the resistance characteristics according to the present invention with the resistance characteristics according to the conventional prior art.
Figure 24:
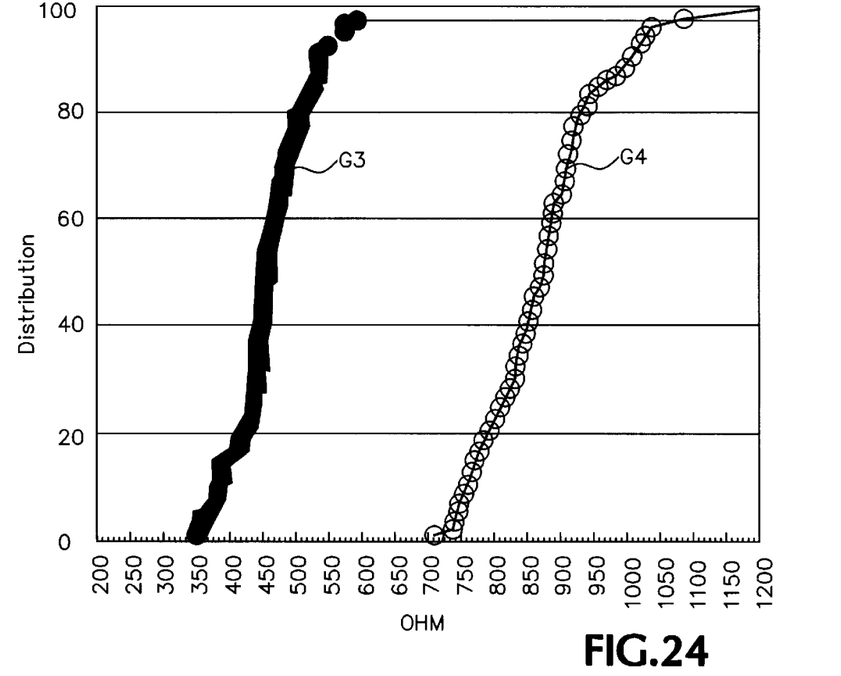

FIG. 23 and FIG. 24 are graphs for comparing the resistance characteristics of the present invention with the resistance characteristics of the conventional prior art. The first and second graphs G1, G2 in FIG. 23 indicate the distribution in the ohmic contact resistance between the conductive plug and the bit line and the third and fourth graphs G3, G4 in FIG. 24 indicate the distribution of the ohmic contact resistance between the bit line and the substrate according to the embodiment of the present invention and the conventional prior art, respectively.

Having described embodiments of a contact forming method and a method of fabricating the semiconductor memory device, it is noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, that is claims and desired protected by the Letters Patent is set forth in the appended claims.

For example, a skilled person in this field may apply the technical sprit of the invention to a contact forming process for a contact of an upper wiring layer connecting cells and a peripheral circuit region and also to a contact forming process for a semiconductor device including an internal voltage transistor. Accordingly, since the technical spirit of the invention may be applied to embodiments other than the aforementioned disclosures, the protective scope of the invention should be defined not by the aforementioned embodiments, but by the technical spirit described in the claims that follow.

What is claimed is:

1. A contact forming method for a semiconductor memory device having a cell array region, a peripheral circuit regions, and gate node contact regions in a transistor forming region, comprising the steps of:

forming gates at the cell array region, a plurality of active regions, and a field insulating layer of the peripheral circuit region, and forming corresponding sources and drains in the active regions;

forming an insulating layer on a whole surface of the peripheral circuit and cell array regions and forming a spacer on the side wall of a gate formed in the cell array region by etching the insulating layer in the cell array region, and thereafter forming conductive impurities-doped poly silicon layer on the cell array and peripheral circuit regions;

patterning the poly silicon layer formed in the cell array region, and etching the poly silicon layer and the insulating layer formed in the peripheral circuit region, thereafter forming a spacer insulating layer on the side wall of the peripheral circuit region;

thinning a capping insulating layer formed on the gate and on the peripheral circuit region for ion-implantation of conductive impurities; and forming a high doping concentration on the poly silicon layer formed on the cell array region.

2. The method as defined in claim 1, wherein the steps further comprise:

forming an interlayer insulating layer on the entire surface of the cell array and peripheral circuit regions to prevent shorts in bit lines being formed on a pad poly silicon layer within the cell array region and the upper portion;

forming bit lines being connected to the pad silicon layer through the interlayer insulating layer;

forming a contact hole after a second interlayer insulating layer covering the bit lines formed on the interlayer insulating layer; and forming a contact plug in the contact hole.

3. The method as defined in claim 1, wherein an insulating oxide layer is formed with silicon nitride in the order of about 500 Å to 2500 Å in thickness.

4. The method as defined in claim 1, wherein the step of thinning the capping insulating layer is continuously performed until the capping insulating layer is in the range of about 200 Å to 1000 Å in thickness.

5. A contact forming method for a semiconductor memory device having a cell array region and a peripheral circuit region comprising the steps of:

forming a device isolation layer for defining an active region on a substrate of the cell array region and the peripheral circuit region;

forming a gate deposition material on the device isolation layers of the peripheral circuit region, the active region of the peripheral circuit region, and the cell array region;

forming sources/drains on the active region of the cell array region and the peripheral circuit region;

forming a first insulating layer covering the gate deposition material on the substrate, and patterning the first insulating layer so that the sources/drains between the gate deposition material in the cell array region are exposed;

filling regions where the sources/drains of the cell array region are exposed with conductive plugs;

forming a second insulating layer on the first insulating layer, and forming contact holes by performing an etching process so that the conductive plugs of the cell array region, the sources/drains of the peripheral circuit region and the gate deposition material are exposed;

forming a first conductive impurity layer on the exposed regions of the first insulating layer and conductive plugs; and forming a metal wiring layer in contact with the exposed regions of the conductive impurity layer.

6. The method as defined in claim 5, further comprising the step of forming a second conductive impurity layer on the conductive plug, prior to the formation of the second insulating layer.

7. The method as defined in claim 5, wherein the metal wiring layer is formed of a titanium (Ti) layer, titanium nitride (TiN) layer and tungsten (W) layer.

* * * * *

UNITED STATES PATENT AND TRADEMARK OFFICE
CERTIFICATE OF CORRECTION

PATENT NO. : 6,555,450 B2 Page 1 of 1
DATED : April 29, 2003
INVENTOR(S) : Park et al.

It is certified that error appears in the above-identified patent and that said Letters Patent is hereby corrected as shown below:

<u>Title page,</u>
Item [56], References Cited, U.S. PATENT DOCUMENTS, should include:
-- 5,856,219   1/1999   Naito, et al.   438/241 --.

<u>Column 9,</u>
Line 14, "peripheral circuit regions" should read -- peripheral circuit region --.

Signed and Sealed this

Tenth Day of February, 2004

JON W. DUDAS
*Acting Director of the United States Patent and Trademark Office*